(12) United States Patent
Alligand

(10) Patent No.: US 11,996,868 B2
(45) Date of Patent: May 28, 2024

(54) ADAPTIVE DELTA COMPRESSION FOR TIMESERIES DATA

(71) Applicant: Quasardb Sas, Paris (FR)

(72) Inventor: Edouard Alligand, New York, NY (US)

(73) Assignee: Quasardb Sas, Paris (FR)

( * ) Notice: Subject to any disclaimer, the term of this patent is extended or adjusted under 35 U.S.C. 154(b) by 69 days.

(21) Appl. No.: 17/072,780

(22) Filed: Oct. 16, 2020

(65) Prior Publication Data

US 2021/0119641 A1 Apr. 22, 2021

Related U.S. Application Data

(60) Provisional application No. 62/923,078, filed on Oct. 18, 2019.

(51) Int. Cl.
  *G06F 16/20* (2019.01)
  *G06F 16/215* (2019.01)
  *H03M 7/30* (2006.01)

(52) U.S. Cl.
  CPC .......... *H03M 7/70* (2013.01); *G06F 16/215* (2019.01); *H03M 7/3086* (2013.01)

(58) Field of Classification Search
  CPC ...... G06F 16/215; H03M 7/70; H03M 7/3086
  See application file for complete search history.

(56) References Cited

U.S. PATENT DOCUMENTS

| | | | | |
|---|---|---|---|---|
| 5,903,675 | A * | 5/1999 | Moledina | G06T 9/004 |
| | | | | 382/190 |
| 7,071,935 | B1 * | 7/2006 | Deering | G06T 15/04 |
| | | | | 345/419 |
| 10,419,019 | B2 * | 9/2019 | Miliotis | H03M 7/30 |
| 10,447,296 | B1 * | 10/2019 | Sofia | H03M 7/6076 |
| 10,732,902 | B1 * | 8/2020 | Lazier | G06F 16/2228 |
| 10,827,039 | B1 * | 11/2020 | Dandekar | H04L 69/04 |
| 2004/0081238 | A1 * | 4/2004 | Parhy | H04N 19/51 |
| | | | | 375/E7.115 |
| 2012/0191668 | A1 * | 7/2012 | Leppard | G06F 16/90 |
| | | | | 707/693 |
| 2013/0262538 | A1 * | 10/2013 | Wegener | H03M 7/30 |
| | | | | 708/203 |
| 2016/0246811 | A1 * | 8/2016 | Ackerman | G06F 16/1744 |
| 2016/0357828 | A1 * | 12/2016 | Tobin | G06F 16/248 |
| 2017/0090776 | A1 * | 3/2017 | Kowles | G06F 3/0685 |
| 2018/0011796 | A1 * | 1/2018 | Guilford | G06F 12/10 |
| 2019/0378074 | A1 * | 12/2019 | McPhatter | G06Q 10/067 |
| 2020/0091930 | A1 * | 3/2020 | Nag | H03M 7/3079 |
| 2020/0249877 | A1 * | 8/2020 | McIlroy | G06F 16/1744 |
| 2021/0036714 | A1 * | 2/2021 | Martin | G06F 13/1668 |

FOREIGN PATENT DOCUMENTS

WO  WO-2019114655 A1 *  6/2019

* cited by examiner

Primary Examiner — Tarek Chbouki
(74) Attorney, Agent, or Firm — David R. Stevens; Stevens Law Group

(57) ABSTRACT

Example systems and methods that perform adaptive delta compression for timeseries data are described. In one implementation, one or more computer processors analyze timeseries data to identify properties about the data. The one or more computer processors select at least one compression primitive based on at least one test. A window size is dynamically changed based on the analysis results and the at least one compression primitive.

25 Claims, 6 Drawing Sheets

100

| Date | Time | Temperature |
|---|---|---|
| 10-31-2020 | 01:23PM | 167.4 |
| 10-31-2020 | 01:25PM | 167.3 |
| 10-31-2020 | 01:27PM | 167.2 |
| 10-31-2020 | 01:29PM | 167.4 |
| 10-31-2020 | 01:31PM | 167.5 |
| 10-31-2020 | 01:33PM | 168.1 |
| 10-31-2020 | 01:35PM | 167.9 |
| 10-31-2020 | 01:37PM | 168.2 |
| 10-31-2020 | 01:39PM | 168.4 |
| 10-31-2020 | 01:41PM | 168.5 |

FIG. 1

ADAPTIVE DELTA COMPRESSION FOR TIMESERIES DATA

RELATED APPLICATION

This application claims the priority benefit of U.S. Provisional Application Ser. No. 62/923,078, entitled "Adaptive Delta Compression for Timeseries Data," filed Oct. 18, 2019, the disclosure of which is incorporated by reference herein in its entirety.

TECHNICAL FIELD

The present disclosure relates to systems and methods for analyzing timeseries data to compute an average delta.

BACKGROUND

Some data compression systems use a principle referred to as "dictionary compression," which works by building a dictionary of the most frequent pieces of data being processed. This type of system then proceeds to write the indexes to those references. In some situations, dictionary compression systems are fast and reasonably efficient. However, for certain types of data, these systems may be slow and impractical.

For example, timeseries data represents the value of a measurement recorded multiple times over a period of time (e.g., measuring a temperature at a specific location at periodic one-minute intervals). When compressing timeseries data, the dictionary compression approach may not be as fast as certain fast storage devices currently available. Additionally, systems that use dictionary compression can have a highly variable speed and degenerate inputs typically don't compress well. These issues with systems that use dictionary compression may significantly slow down the data compressor. Thus, it is desirable to provide improved systems for processing timeseries data.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

FIG. 1 illustrates a table depicting an example of timeseries data.

DETAILED DESCRIPTION

Figure 2:
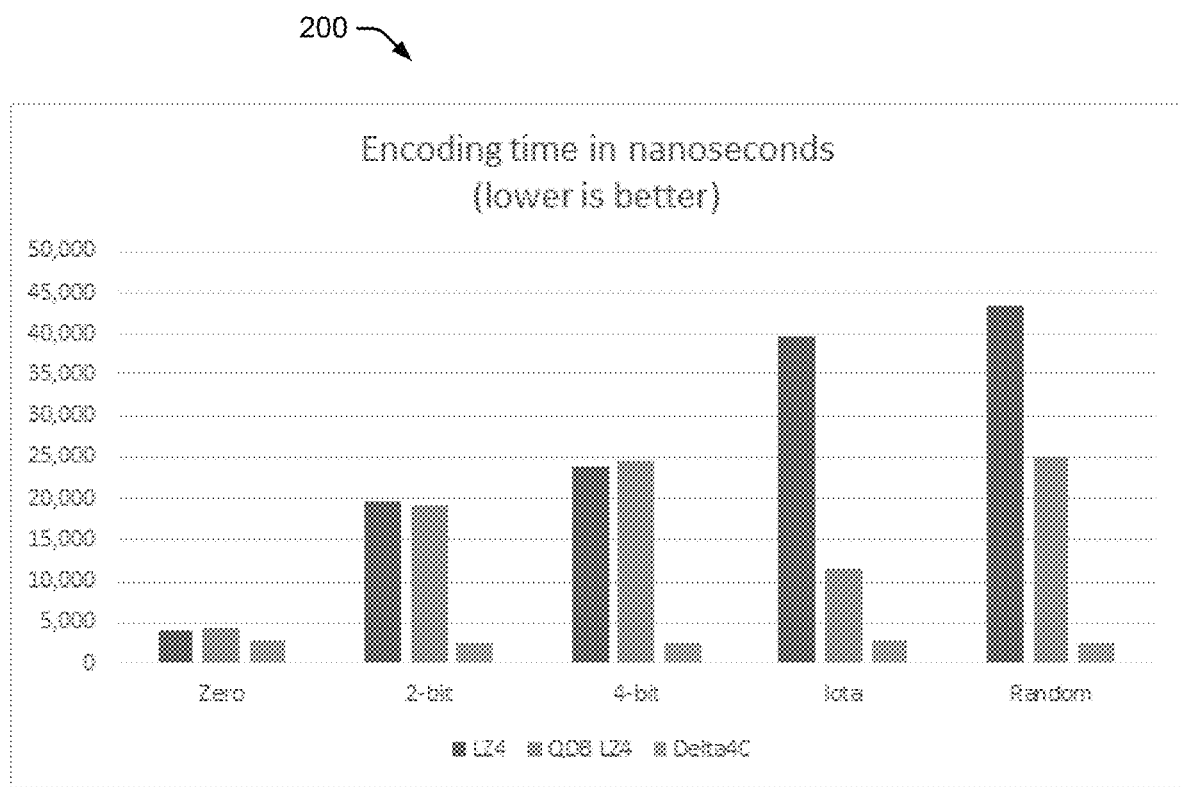
FIG. 2 illustrates a graph depicting example compression times (also referred to as encoding times) for different compression algorithms.

In the following disclosure, reference is made to the accompanying drawings, which form a part hereof, and in which is shown by way of illustration specific implementations in which the disclosure may be practiced. It is understood that other implementations may be utilized and structural changes may be made without departing from the scope of the present disclosure. References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Implementations of the systems, devices, and methods disclosed herein may comprise or utilize a special purpose or general-purpose computer including computer hardware, such as, for example, one or more processors and system memory, as discussed herein. Implementations within the scope of the present disclosure may also include physical and other computer-readable media for carrying or storing computer-executable instructions and/or data structures. Such computer-readable media can be any available media that can be accessed by a general purpose or special purpose computer system. Computer-readable media that store computer-executable instructions are computer storage media (devices). Computer-readable media that carry computer-executable instructions are transmission media. Thus, by way of example, and not limitation, implementations of the disclosure can comprise at least two distinctly different kinds of computer-readable media: computer storage media (devices) and transmission media.

Computer storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

An implementation of the devices, systems, and methods disclosed herein may communicate over a computer network. A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links, which can be used to carry desired program code means in the form of computer-executable instructions or data structures and which can be accessed by a general purpose or special purpose computer. Combinations of the above should also be included within the scope of computer-readable media.

Computer-executable instructions comprise, for example, instructions and data which, when executed at a processor, cause a general purpose computer, special purpose computer, or special purpose processing device to perform a certain function or group of functions. The computer executable instructions may be, for example, binaries, intermediate format instructions such as assembly language, or even source code. Although the subject matter is described in language specific to structural features and/or methodological acts, it is to be understood that the subject matter defined in the appended claims is not necessarily limited to the described features or acts described herein. Rather, the described features and acts are disclosed as example forms of implementing the claims.

Those skilled in the art will appreciate that the disclosure may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, tablets, pagers, routers, switches, various storage devices, and the like. The disclosure may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Further, where appropriate, functions described herein can be performed in one or more of: hardware, software, firmware, digital components, or analog components. For example, one or more application specific integrated circuits (ASICs) can be programmed to carry out one or more of the systems and procedures described herein. Certain terms are used throughout the description and claims to refer to particular system components. As one skilled in the art will appreciate, components may be referred to by different names. This document does not intend to distinguish between components that differ in name, but not function.

At least some embodiments of the disclosure are directed to computer program products comprising such logic (e.g., in the form of software) stored on any computer useable medium. Such software, when executed in one or more data processing devices, causes a device to operate as described herein.

The systems and methods described herein are related to adaptive delta compression for timeseries data. These systems and methods are useful in analyzing an integer timeseries to compute the average delta. The described systems and methods are useful in a variety of database systems and database management systems. Particular implementations are useful to determine database performance and accurately assess the database performance. Although particular examples discussed herein describe timeseries data, similar systems and methods may be used with other types of data and other data structures.

In some embodiments, the described systems and methods can perform multiple statistical analysis approaches simultaneously to determine which of the multiple statistical analysis approaches provide the best results.

Timeseries data represents the value of a measurement recorded multiple times over a period of time, such as measuring the temperature at a specific location on a regular basis (e.g., every hour for 365 days). FIG. 1 illustrates a table 100 depicting an example of timeseries data. The example of FIG. 1 shows temperature data collected on a particular date at two minute intervals.

Timeseries data can be any type of data measured or received at any time interval, for any length of time, and from any data source. In some embodiments, new data is received on a continuous basis, which requires a continually growing data storage area to store the ever-growing data entries. In particular situations, timeseries data has patterns such that new data values may have a high correlation with previous data values.

As mentioned above, some data compression systems us a principle called "dictionary compression," which works by building a dictionary of the most frequent pieces of data. This system then proceeds to write the indexes to these references. In some situations, dictionary compression systems are fast and reasonably efficient. In some situations, dictionary compression systems can be combined with other techniques to produce even better results.

In some embodiments, when the systems and methods know what kind of data is being processed, the systems and methods can be much more efficient. For example, audio compression utilities can attempt to "predict" the next data due to the inherent properties of sound. When discussing audio compression, it's important to talk about the two types of compression: lossy and lossless. Lossy compression is used when it is acceptable to lose some signal to save space. Lossless compression is used when it is important to reproduce the original signal bit-for-bit without any loss of signal data. For lossy audio compression, the strategy is to remove signals that a person can hardly hear, making it sound "as if" the person is listening to the original data.

One strategy for compressing timeseries data is using a lossy strategy, such as:

Remove data older than X; and/or

Beyond a certain point, accept the loss of resolution and aggregate the data

For example, with financial data, a typical use case is to transform tick-by-tick data into minutes bars, minutes bars into daily bars, and so forth. This approach may be acceptable if you are sure about the information resolution you need. For example, it can be argued that most users and entities rarely need a record of second-by-second disk usage of your servers from three years ago.

In some situations, such as finance and predictive maintenance, there can be significant useful information in the "weak signals" and the data that might be discarded with a lossy compression technique. In these situations, a lossy compression system may not be the best choice. For example, if data is being used for simulation, the absence of the weak signals can have negative consequences on the simulation.

As mentioned above, when compressing timeseries data, the dictionary compression approach may not be as fast as certain fast storage devices currently available. Additionally, systems that use dictionary compression can have a highly variable speed and degenerate inputs typically don't compress well. These issues with systems that use dictionary compression may significantly slow down the data compression systems and methods.

In some embodiments, the systems and methods described herein use LZ4 (a lossless data compression algorithm) with pre-processing phases that leverage the nature of numerical timeseries to avoid the degenerate cases and enhance the efficiency of the LZ4 compression algorithm.

In some implementations, when processing numerical timeseries data, the described systems and methods use delta compression, or delta-delta. This technique stores the differences (a first derivative), or the variation of the differences (a second derivative) instead of the values. When the difference of two values can be encoded with less bits than the actual values, then the difference is smaller than the values.

In some embodiments, the adaptive delta compression systems and methods described herein (the modified LZ4 technique) outperforms the delta (or delta-delta) technique. In particular situations, it was determined that an (almost) absolutely monotonic series would compress very well with delta compression, but the further the data varies, the less efficient the compression became. In some situations, delta compression can miss patterns that dictionary compression can take advantage of And, in real life, these patterns are often the majority.

In many situations, it is desirable to choose the best strategy for the data being processed and switch strategies as the processing continues. But, a problem with switching strategies is that it can consume additional RAM (Random-Access Memory) or CPU (Central Processing Unit) resources, and sometimes both. In some embodiments, a baseline is set that expects the processing to be faster than LZ4 and compress better in 95% of the cases.

The systems and methods discussed herein were developed based on multiple tests on large amounts of data. These systems and methods implement an adaptive delta compression technique. As described herein, the systems and methods perform multiple statistical analyses of a data set simultaneously to determine which compression approach will produce the best results for the data set (or, generally, for this type of data set).

FIG. 2 illustrates a graph 200 depicting example compression times (also referred to as encoding times) for different compression algorithms. As shown in FIG. 2, the data sets are processed with three different compression algorithms:
1) LZ4 (the left bar in graph 200)
2) LZ4 with a pre-processing optimization, referred to as QDB LZ4 (the middle bar in graph 200)
3) Delta4C (adaptive delta compression), which is the right bar in graph 200

Graph 200 in FIG. 2 illustrates some typical data distributions for timeseries data. In this example, the systems and methods are compress an array of 4,096 signed 64-bit integers (32 KB of data). Graph 200 shows the compression times for five different types of data. Each of the three compression algorithms are applied to each type of data. The five types of data tested include:
1. Zeros
2. Monotonic with a random increase with 2-bit entropy
3. Monotonic with a random increase with 4-bit entropy
4. Absolutely monotonic data (iota)
5. Random data As shown in graph 200, the Delta4C compression algorithm provided the fastest compression times for all five types of data. The Delta4C compression algorithm provided a substantially constant compression time for each type of data.

Figure 3:
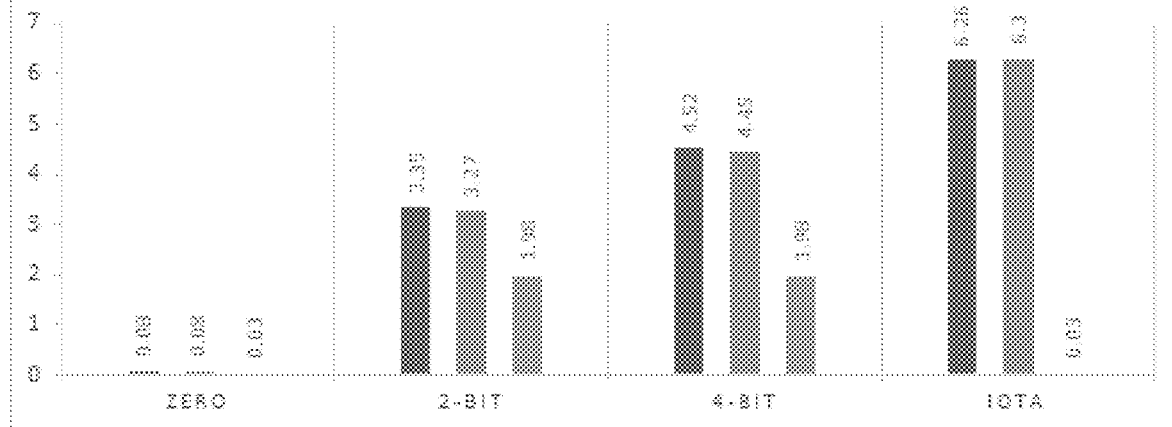
FIG. 3 illustrates a graph depicting example compressed data sizes (as a percentage of the original data size) for different compression algorithms.

FIG. 3 illustrates a graph 300 depicting example compressed data sizes (as a percentage of the original data size) for the three different compression algorithms discussed above with respect to FIG. 2. The three bars in each portion of graph 300 are arranged the same as in graph 200 (left bar is LZ4, middle bar is QDB LZ4, right bar is Delta4C). As shown in graph 300, the Delta4C compression algorithm also provided the best compression of the data. Graph 300 also shows that the Delta4C compression algorithm is better than the other tested compression algorithms at being able to recognize the iota pattern. The iota pattern is an example of how the described systems and methods can beat dictionary compression for timeseries data. The iota pattern refers to, for example, a monotonic pattern (1, 2, 3, 4, 5) with a constant growth interval.

In some embodiments, the Delta4C compression algorithm is a compression stack designed for numerical timeseries data. The compression stack may have three components:
1. Analysis
2. Compression primitives library
3. Dynamic windowing As used herein, a compression primitive is an algorithm that receives an uncompressed text and outputs a compressed text. The compression primitive does not typically have any mechanism to measure its efficiency. Therefore, the statistical analysis (e.g., the analysis phase) determines whether the compression primitive is adequate (e.g., performs at least a reasonable amount of compression).

Analysis phase. This phase includes an algorithm that quickly scans the timeseries data to find some fundamental properties about the data. For example, if the data fits well in a pre-built model, if it is monotonic, or if its entropy is very high or very low. In some embodiments, pre-built models may include:
1. Models for strictly monotonic data (with some jitter)
2. Models that detect typical sensor/financial data and use appropriate encoding
3. Models for dispersion and variance For example, if the analysis process determines that the timeseries data has a majority of small values, it can use a specific compression strategy. The analysis phase is unconditionally executed. It outputs a series of frames with scores for each compression algorithm. In some embodiments, the analysis phase produces specific results. Based on those results, the systems and methods choose one of the pre-defined algorithms. Thus, the analysis is constant in time, and it chooses from a catalog of algorithms based on the results of the analysis phase.

In some embodiments, the analysis process may read all of the data so that the algorithm can determine whether the data is timestamps, integers, doubles, and so forth. If the data being read is timestamp data, the analysis process measures the delta between each value with an ultra-high-speed SIMD (Single Instruction, Multiple Data) implementation. If the delta is constant, the systems and methods choose the best encoding based on the delta, such as first value or delta. If the delta is not constant, the systems and methods use delta encoding, delta-delta encoding, or optimized dictionary compression.

Compression primitives library. This library includes several compression primitives that the compressor can choose from. In some embodiments, the compression primitives are related to computing the differences of values (or sometimes a difference of the difference of values) because they are usually smaller than the real values. For example, the timeseries 1000, 1002, 1005 can be encoded as "1000, +2, +5" (delta) or "1000, +2, +3" (delta-delta). The systems and methods described herein select from multiple different implementation options that favor speed or compression, thereby giving the systems and methods a larger choice of compression options. In some embodiments, multiple tests are performed to determine which compression primitive is likely to yield good results depending on the results of the analysis phase. When selecting from multiple different implementation options, the described systems and methods may use a SIMD implementation that can do two encodings in a single pass (e.g., delta and delta-delta). The systems and methods then select the encoding approach that produces the best output. In some embodiments, if the systems and methods are uncertain as to whether delta, delta-delta, or another approach will work best, the systems and methods may default to using the modified LZ4 technique discussed herein.

Dynamic windowing. The Delta4C compression algorithm uses dynamic windowing (e.g., changing the size of the window dynamically), based on the analysis phase and the best compression primitive. In one example, the data includes: 1000, 1001, 1002, 1003, 1020, 1020, 1020, 1030, 1035, and 1034. This example data can be separated into three windows:

- Window 1. Data 1000, 1001, 1002, 1003: strictly monotonic. This data can be encoded as 1000 with an increment of 1 three times.
- Window 2. Data 1020, 1020, 1020: strictly monotonic. This data can be encoded as 1020 with an increment of 0 two times.
- Window 3. Data 1030, 1035, 1034. This data can be encoded as delta or delta-delta.

When possible, the described systems and methods attempt several compression algorithms at the same time and chose the best output. In some embodiments, the result is several frames, where a frame is compressed data using a specific compression primitive. As compared to dictionary compression or pure delta compression, the results using the systems and methods described herein are superior.

In some embodiments, some data may be flagged as "not compressible" (e.g., too random) during the analysis phase. For example, if the dispersion is too high, the systems and methods may attempt dictionary compression. If the compression results are not good enough, the systems and methods do not compress that data.

Figure 4:
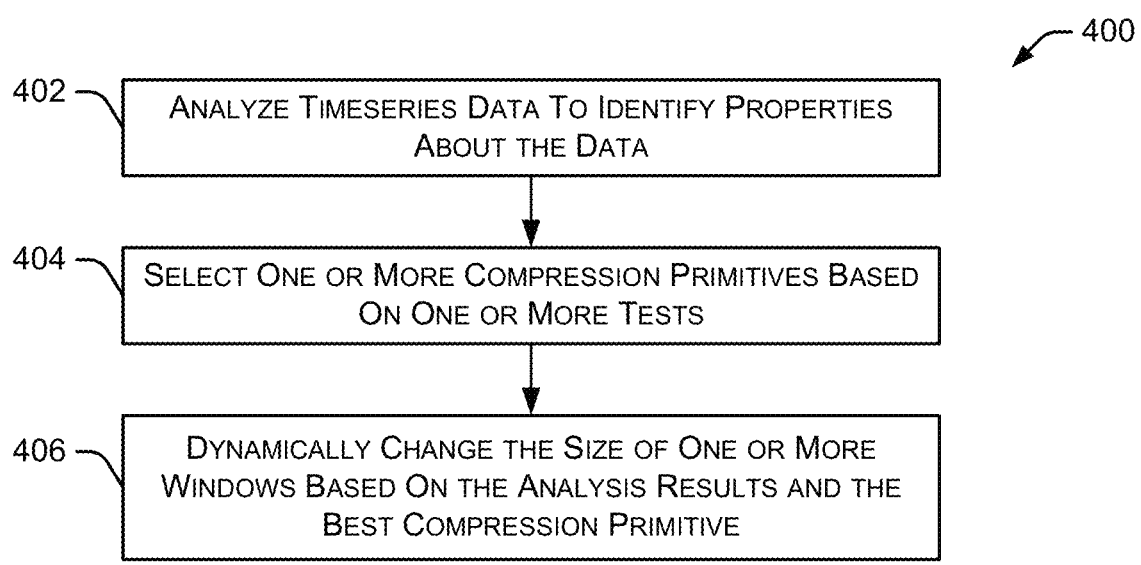
FIG. 4 is a flow diagram illustrating an embodiment of a method for implementing the Delta4C compression algorithm.

FIG. 4 is a flow diagram illustrating an embodiment of a method 400 for implementing the Delta4C compression algorithm discussed herein. Initially, the method analyzes 402 timeseries data to identify properties about the data. Compression primitives are selected 404 based on one or more tests (e.g., tests performed on the data to be compressed). Method 400 then dynamically changes 406 the size of one or more windows based on the analysis results and the best compression primitive.

Additional systems and methods described herein are related to dynamic data affinity for distributed hash tables. These systems and methods are useful in a variety of database systems and database management systems. Particular implementations are useful in high-performance, distributed, timeseries databases.

A distributed hash table (DHT) is a type of decentralized distributed system that provides a lookup service that is similar to a hash table. Key-value pairs are stored in the DHT. A participating node can efficiently retrieve the value associated with a particular key. The keys are identifiers that map to a specific value. These values can be any type of data, information, and the like. The responsibility for maintaining the mapping of keys to specific values is distributed across multiple nodes.

In some embodiments, a DHT is a distributed lookup service that gives access to data distributed over a network of nodes by making it look like a big dictionary (or key-value store). In some implementations, distribution of the data on a DHT is random, especially if the hash function used is cryptographically strong, as it is, for example, in Chord. Chord is a protocol and algorithm for a peer-to-peer distributed hash table. Chord specifies how keys are assigned to nodes and how a node can discover the value for a given key by first locating the node responsible for that key.

In a DHT environment, a key "A" can be on machine "1" and a key "B" can be on machine "2". The probability of the two keys (A and B) being on different machines is 50% with a two node cluster. Thus, the random diffusion of data on a DHT makes it hard to cluster data together, which may result in a performance loss.

In some situations, grouping data together is desirable because a system or method may want data that has a semantic relation to be available on the same node, which prevents useless network transfers that cause delay in handling data access requests and increase network traffic. This grouping of data can be accomplished using locality sensitive hashing. However, this approach is not typically possible with cryptographically strong hashing functions. In other words, certain systems and methods may want key "A" and key "B" to always (e.g., 100% probability) be on the same machine ("1" or "2") because they have a semantic relationship with each other, such as two columns of the same table. Additionally, if the DHT uses Multi-Version Concurrency Control (MVCC), this adds another level of complexity because multiple versions of the same entry can exist at the same time.

In some embodiments, the systems and methods discussed herein may use a dictionary to cluster otherwise unrelated keys together and generate keys that are guaranteed to be unique and clustered together. By adding a level of indirection, the systems and methods ensure that different keys, which may otherwise be randomly distributed over the cluster, will be grouped together on a specific node. This level of indirection cooperates with the MVCC mechanisms to prevent collisions and ensure uniform visibility of the data.

In some embodiments, every key has data and metadata. The metadata is the value of the key and contains the "data key" which contains the actual data for the current version of the key (Multi-Version Concurrency Control). In some implementations, the data key is the hash of the key, plus a timestamp to uniquely identify the version, referred to as the "HASH-VERSION". For example, the metadata may identify the various database entries (or other data information) that needs to be grouped together (e.g., stored on the same machine). In particular implementations, the described systems and methods perform a cryptographic hash of the key to avoid collisions, such as Skein or any other cryptographic hash function.

Keys that need to be grouped together are stored in a directory. The directory may have several subkeys, which will then point to the "data key" containing the data for the subkey. The client is aware that certain keys are actually grouped together in a dictionary, usually by using a special key naming scheme, such as a prefix. In some embodiments, the directory includes a structure that contains all information regarding various database entries. For example, the directory may represent a type of dictionary.

The client thus hashes only a subpart of the key to point to the directory, and the server will use the remaining information to look up the exact information requested by the client. The dictionary ensures that the data keys don't collide with each other, with other keys, other dictionary entries, or newer updates of the directory entry.

In some embodiments, a directory is a dictionary of keys with, for example, the following information:
Subentry type
Subentry size
Subentry version
The following is an example of a data lookup process:
1. A client wants to lookup "group1.keyA"
2. The client only hashes "group1.", and the hash refers to machine "1"
3. The client sends the request to machine "1" for "group1.keyA"
4. Machine "1" accesses the directory contained in "group1"
5. Machine "1" will then lookup for the subentry "keyA"
6. The directory will contain the entry type of key A, and its data key
7. Using the data key, the server will look up the data and perform the requested operation The following is an example of a data creation process:
1. The client creates an entry "group1.keyA"
2. The client only hashes "group1.", and the hash refers to machine "1"
3. The client sends the request to machine "1" for "group1.keyA"
4. Machine "1" accesses the directory contained in "group1"
5. Machine "1" will then lookup for the subentry "keyA"
6. If the subentry does not exist, machine "1" will create it
7. Machine "1" will create a data key that is guaranteed to be unique by hashing hash(hash("group1.")+"keyA") (+ being concatenation) and using the current version of the entry
8. The data is stored at the data key
9. The directory is updated with the new current versions The following is an example of a data update process:
1. The client creates an entry "group1.keyA"
2. The client only hashes "group1.", the hash refers to machine "1"
3. The client sends the request to machine "1" for "group1.keyA"
4. Machine "1" accesses the directory contained in "group1"
5. Machine "1" will then lookup for the subentry "keyA"
6. If the subentry exists, it increments the version number to have another uuid (universal unique identifier)
7. Machine "1" will create a data key that is guaranteed to be unique by hashing hash(hash("group1.")+"keyA") (+ being concatenation) and using the current version of the entry
8. Data is stored at the data key
9. The directory is updated with the new current versions The following is an example of a data deletion process:
1. The client creates an entry "group1.keyA"
2. The client only hashes "group1.", the hash refers to machine "1"
3. The client sends the request to machine "1" for "group1.keyA"
4. Machine "1" accesses the directory contained in "group1"
5. Machine "1" will then lookup for the subentry "keyA"
6. If the subentry exists, the client removes the reference.
7. The directory is updated with the new current versions
8. During a clean-up processes, the database will remove dead references (i.e., data keys without a matching directory)

In some embodiments, the client can hide the underlying mechanism of the keys, or know that certain types of keys are only available in directories, thus hiding the complexity to the user who may be unaware that multiple keys are being requested.

Figure 5:
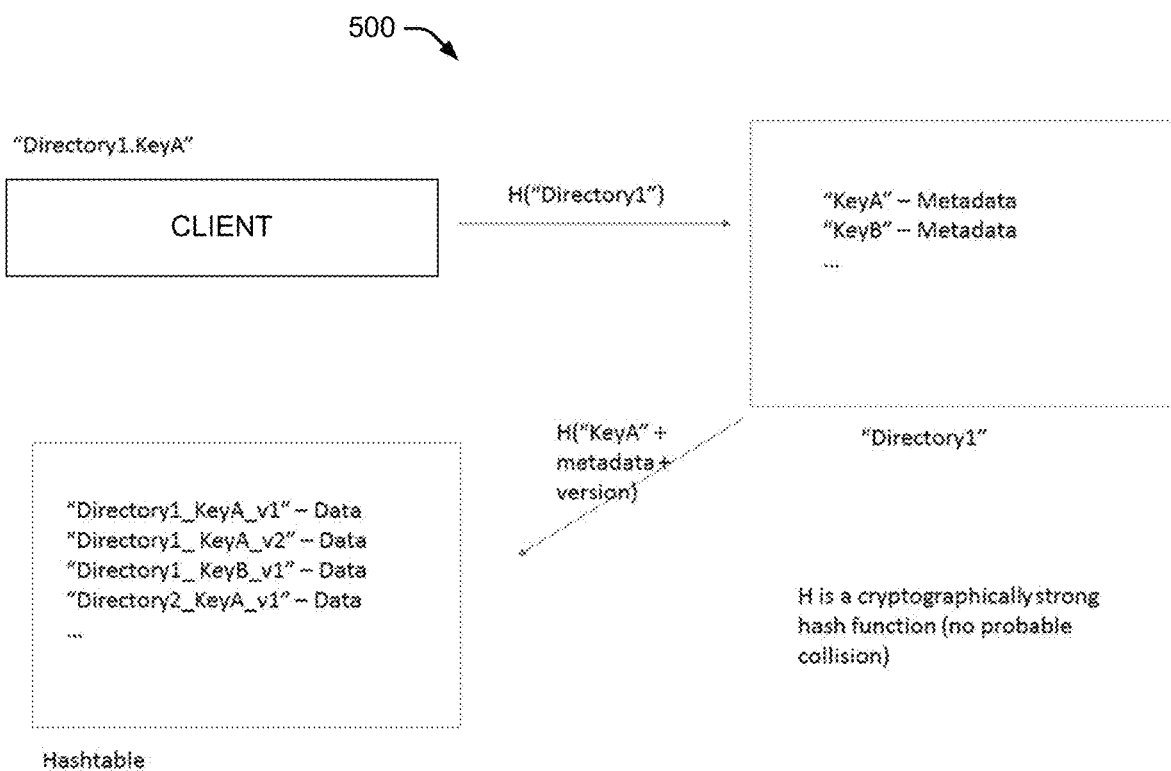
FIG. 5 illustrates an example data/directory structure (also referred to as a schema).

FIG. 5 illustrates an example data/directory structure 500, which is also referred to as a schema. For example, FIG. 5 depicts a client communicating with a directory, which communicates with a hash table. As mentioned above, H is a cryptographically strong hash function.

Figure 6:
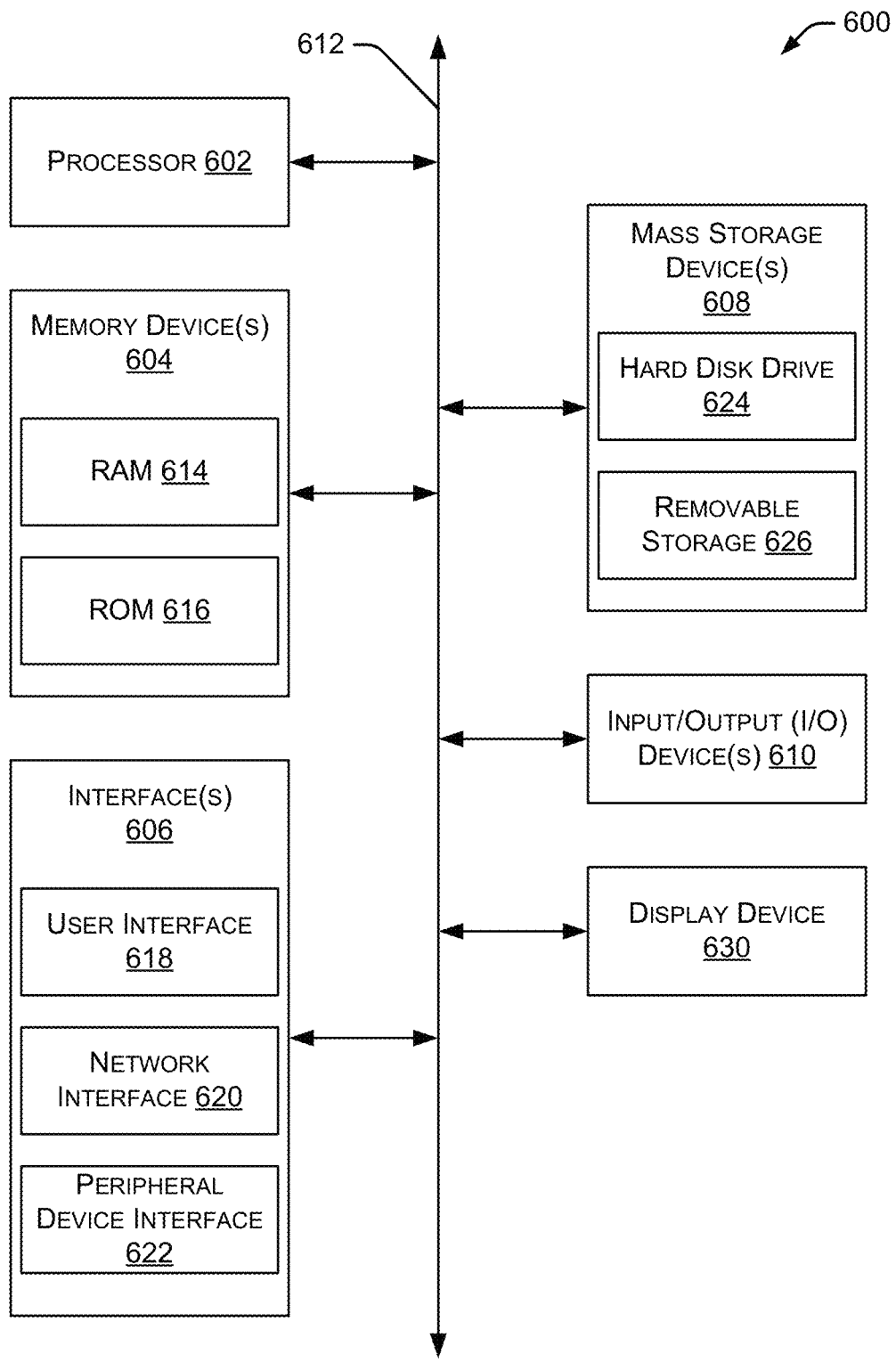
FIG. 6 is a block diagram illustrating an example computing device suitable for implementing the systems and methods described herein.

FIG. 6 is a block diagram illustrating an example computing device 600 suitable for implementing the systems and methods described herein. In some embodiments, a cluster of computing devices interconnected by a network may be used to implement any one or more components of the invention.

Computing device 600 may be used to perform various procedures, such as those discussed herein. Computing device 600 can function as a server, a client, or any other computing entity. Computing device 600 can perform various order management and order processing functions as discussed herein. Computing device 600 can be any of a wide variety of computing devices, such as a desktop computer, a notebook computer, a server computer, a handheld computer, tablet computer and the like.

Computing device 600 includes one or more processor(s) 602, one or more memory device(s) 604, one or more interface(s) 606, one or more mass storage device(s) 608, one or more Input/Output (I/O) device(s) 610, and a display device 630 all of which are coupled to a bus 612. Processor(s) 602 include one or more processors or controllers that execute instructions stored in memory device(s) 604 and/or mass storage device(s) 608. Processor(s) 602 may also include various types of computer-readable media, such as cache memory.

Memory device(s) 604 include various computer-readable media, such as volatile memory (e.g., random access memory (RAM) 614) and/or nonvolatile memory (e.g., read-only memory (ROM) 616). Memory device(s) 604 may also include rewritable ROM, such as Flash memory.

Mass storage device(s) 608 include various computer readable media, such as magnetic tapes, magnetic disks, optical disks, solid-state memory (e.g., Flash memory), and so forth. As shown in FIG. 6, a particular mass storage device is a hard disk drive 624. Various drives may also be included in mass storage device(s) 608 to enable reading from and/or writing to the various computer readable media. Mass storage device(s) 608 include removable media 626 and/or non-removable media.

I/O device(s) 610 include various devices that allow data and/or other information to be input to or retrieved from computing device 600. Example I/O device(s) 610 include cursor control devices, keyboards, keypads, microphones, monitors or other display devices, speakers, printers, network interface cards, modems, lenses, CCDs or other image capture devices, and the like.

Display device 630 includes any type of device capable of displaying information to one or more users of computing device 600. Examples of display device 630 include a monitor, display terminal, video projection device, and the like.

Interface(s) 606 include various interfaces that allow computing device 600 to interact with other systems, devices, or computing environments. Example interface(s) 606 include any number of different network interfaces 620, such as interfaces to local area networks (LANs), wide area networks (WANs), wireless networks, and the Internet.

Other interface(s) include user interface 618 and peripheral device interface 622. The interface(s) 606 may also include one or more user interface elements 618. The interface(s) 606 may also include one or more peripheral interfaces such as interfaces for printers, pointing devices (mice, track pad, etc.), keyboards, and the like.

Bus 612 allows processor(s) 602, memory device(s) 604, interface(s) 606, mass storage device(s) 608, and I/O device(s) 610 to communicate with one another, as well as other devices or components coupled to bus 612. Bus 612 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 600, and are executed by processor(s) 602. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

While various embodiments of the present disclosure are described herein, it should be understood that they are presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the described exemplary embodiments, but should be defined only in accordance with the following claims and their equivalents. The description herein is presented for the purposes of illustration and description. It is not intended to be exhaustive or to limit the disclosure to the precise form disclosed. Many modifications and variations are possible in light of the disclosed teaching. Further, it should be noted that any or all of the alternate implementations discussed herein may be used in any combination desired to form additional hybrid implementations of the disclosure.

The invention claimed is:

1. A method comprising:
analyzing, using one or more computer processors, timeseries data, wherein the analysis includes:
processing at least a portion of the timeseries data to generate a set of frames with scores for each of one or more compression algorithms; and
comparing the scores;
determining whether the timeseries data is compressible based on the comparing;
if the timeseries data is determined to be compressible:
testing a data compression performance of an adaptive delta compression method on the timeseries data;
responsive to the data compression performance being greater than a threshold, selecting the adaptive delta compression method as a compression primitive, wherein the adaptive delta compression method includes selecting between a delta compression method and a delta-delta compression method;
responsive to the data compression performance being less than the threshold, selecting a modified LZ4 compression method as the compression primitive;
dynamically changing a data window size based on the analysis results and the compression primitive; and
if the timeseries data is determined to be not compressible, performing no compression on the timeseries data.

2. The method of claim 1, wherein analyzing the timeseries data includes scanning the timeseries data to determine data properties.

3. The method of claim 2, wherein the data properties includes at least one of timestamp data, integer data, and doubles data.

4. The method of claim 2, wherein the data properties include at least one of monotonic data, high entropy data, and low entropy data.

5. The method of claim 2, wherein the one or more computer processors further select a data processing model based on the data properties, wherein the data processing model includes at least one of a model for strictly monotonic data, a model to detect sensor data, a model to detect financial data, and a model for dispersion and variance.

6. The method of claim 1, wherein the compression primitive is an algorithm that receives an uncompressed text and outputs a compressed text.

7. The method of claim 6, further comprising performing a statistical analysis of the compression primitive to determine its compression efficiency.

8. The method of claim 1, wherein dynamically changing the window size includes defining a plurality of windows, where each of the plurality of windows is associated with a type of data.

9. The method of claim 1, further comprising compressing the timeseries data using an LZ4 data compression algorithm.

10. The method of claim 1, further comprising compressing the timeseries data using at least one of a delta, delta-delta, and modified LZ4 data compression algorithm.

11. The method of claim 1, wherein the at least one compression primitive is selected from a compression primitives library.

12. The method of claim 1, further comprising:
compressing the timeseries data using a first compression algorithm to generate a first compression result; and
compressing the timeseries data using a second compression algorithm to generate a second compression result, wherein the first and second compression results are generated simultaneously.

13. The method of claim 12, further comprising:
analyzing the first compression result;
analyzing the second compression result; and
selecting the first compression result or the second compression result depending on the best compression result.

14. The method of claim 12, wherein the simultaneous generation of compression results is performed using a single instruction, multiple data (SIMD) operation.

15. A method comprising:
analyzing, using one or more computer processors, a set of samples of timeseries data to identify properties associated with the data, wherein the analysis includes:
processing at least a portion of the timeseries data to generate a set of frames with scores for each of one or more compression algorithms; and
comparing the scores;
determining, based on the analysis, whether the timeseries data is compressible based on the comparing;
if the timeseries data is determined to be compressible:
selecting, using one or more computer processors, at least one compression primitive based on at least one test;

compressing the set of samples of the timeseries data using a first compression algorithm to generate a first compression result; and compressing the set of samples of the timeseries data using a second compression algorithm to generate a second compression result, wherein the first and second compression results are generated simultaneously.

16. The method of claim 15, further comprising dynamically changing a data window size based on the analysis results and the at least one compression primitive.

17. The method of claim 16, wherein dynamically changing the window size includes defining a plurality of windows, where each of the plurality of windows is associated with a type of data.

18. The method of claim 15, wherein analyzing the timeseries data includes scanning the timeseries data to identify data properties that include at least one of timestamp data, integer data, and doubles data.

19. The method of claim 15, wherein analyzing the timeseries data includes scanning the timeseries data to identify data properties that include at least one of monotonic data, high entropy data, and low entropy data.

20. The method of claim 15, wherein the one or more computer processors further select a data processing model based on the data properties, wherein the data processing model includes at least one of a model for strictly monotonic data, a model to detect sensor data, a model to detect financial data, and a model for dispersion and variance.

21. The method of claim 15, wherein the first compression algorithm includes one of a delta compression algorithm, a delta-delta compression algorithm, an LZ4 compression algorithm, and a modified LZ4 compression algorithm.

22. The method of claim 15, wherein the simultaneous generation of compression results is performed using a single instruction, multiple data (SIMD) operation.

23. A method comprising:
analyzing, using one or more computer processors, timeseries data;
testing a data compression performance of an adaptive delta compression method on the timeseries data;
responsive to the data compression performance being greater than a threshold, selecting the adaptive delta compression method as a compression primitive;
responsive to the data compression performance being less than the threshold, selecting a modified LZ4 compression method as the compression primitive;
dynamically changing a data window size based on the analysis results and the compression primitive; and
defaulting to the modified LZ4 compression method based on the data compression performance testing generating uncertain results.

24. The method of claim 23, wherein the uncertain results are generated based on a randomness of the timeseries data.

25. The method of claim 24, wherein a dispersion associated with the timeseries data is used as a measure of the randomness.

* * * * *